(12) United States Patent
Ogura et al.

(10) Patent No.: US 6,411,023 B1
(45) Date of Patent: Jun. 25, 2002

(54) VACUUM PROCESSING APPARATUS AND ION PUMP CAPABLE OF SUPPRESSING LEAKAGE OF IONS AND ELECTRONS FROM ION PUMP

(75) Inventors: Katsuhito Ogura, Numazu; Ryoichi Hirano, Yokohama; Toru Tojo, Kanagawa-ken, all of (JP)

(73) Assignee: Toshiba Machine Co., Ltd., Tokyo (JP)

( * ) Notice: Subject to any disclaimer, the term of this patent is extended or adjusted under 35 U.S.C. 154(b) by 0 days.

(21) Appl. No.: 09/496,643

(22) Filed: Feb. 3, 2000

(30) Foreign Application Priority Data

Feb. 3, 1999 (JP) ............................................ 11-025900

(51) Int. Cl.[7] .............................................. H05H 19/00
(52) U.S. Cl. .............................. 313/362.1; 313/363.1; 315/111.81; 315/111.91
(58) Field of Search ........................... 313/362.1, 363.1, 313/231.31, 231.51; 315/111.81, 111.91

(56) References Cited

U.S. PATENT DOCUMENTS 4,389,165 A * 6/1983 Ono et al. .................... 417/49
4,638,209 A * 1/1987 Asamaki et al. ........... 313/359.1
5,646,488 A * 7/1997 Warburton .............. 315/111.81
6,025,723 A * 2/2000 Bills .......................... 324/459

* cited by examiner

Primary Examiner—Sandra O'Shea
Assistant Examiner—Ronald E. DelGizzi
(74) Attorney, Agent, or Firm—Pillsbury Winthrop LLP

(57) ABSTRACT

A vacuum processing apparatus performs processing such as a pattern depiction with a charged beam within a process chamber evacuated to a high vacuum by an ion pump. The vacuum processing apparatus, which makes it possible to prevent the accuracy of the charged beam pattern depiction from being deteriorated by ions and electrons leaking from the ion pump, has a conductor and a voltage applying unit. The conductor is arranged in the vicinity of the suction port of the process chamber communicating with the ion pump such that the conductor is electrically insulated from the process chamber. The voltage applying unit imparts a potential differing from that of the process chamber to the conductor. Because of the potential difference between the conductor and the process chamber, the ions and electrons leaking from the ion pump are reflected or adsorbed by the conductor so as to suppress leakage of the ions and electrons into the process chamber.

6 Claims, 2 Drawing Sheets

VACUUM PROCESSING APPARATUS AND ION PUMP CAPABLE OF SUPPRESSING LEAKAGE OF IONS AND ELECTRONS FROM ION PUMP

BACKGROUND OF THE INVENTION

The present invention relates to a vacuum processing apparatus and an ion pump, particularly, to a vacuum processing apparatus for performing, for example, a pattern depicting operation within a process chamber evacuated to a high vacuum by an ion pump like a charged beam pattern depicting apparatus and to an ion pump.

It was customary in the past to use a turbo molecular pump or an ion pump for producing a high vacuum. However, the turbo molecular pump is mechanically vibrated and, thus, cannot be used in the case where the vibration causes the accuracy of the depicted pattern to be lowered as in the charged beam pattern depicting apparatus. Therefore, in the charged beam pattern depicting apparatus, the pattern depicting chamber (process chamber) is evacuated to a high vacuum by the ion pump that is not vibrated at least during the pattern depiction.

However, as a result of an extensive research conducted in an attempt to further improve the accuracy of the pattern depiction in a charged beam pattern depicting apparatus, the present inventors have found that ions or electrons leak from the ion pump to enter the pattern depicting chamber (process chamber), with the result that these leaking ions or electrons chemically react with the resist on which a pattern is to be depicted so as to lower the accuracy of the pattern depiction.

BRIEF SUMMARY OF THE INVENTION

An object of the present invention, which has been achieved on the basis of the finding noted above, is to provide a vacuum processing apparatus capable of suppressing deterioration of the processing caused by leakage of ions and electrons from the ion pump such as a lowered accuracy of the pattern depiction with a charged beam and to provide an ion pump.

According to a first aspect of the present invention, there is provided a vacuum processing apparatus for processing a target object within a process chamber evacuated to a high vacuum by an ion pump, comprising:

a conductor arranged in a vicinity of a suction port of a process chamber communicating with the ion pump, the conductor being electrically insulated from the process chamber; and voltage applying means for imparting potential differing from that of the process chamber to the conductor.

The apparatus of the particular construction permits suppressing leakage of ions and electrons from the ion pump into the process chamber so as to suppress deterioration of the processing and, thus, to improve the accuracy of the pattern depiction.

The process chamber may consist of a pattern depicting chamber in which a pattern is depicted by a charged beam. Also, it is desirable for the voltage applying means to be constructed such that the applied voltage can be controlled depending on the pattern depicting conditions. It is also desirable for the voltage applying means to be constructed such that a positive (+) voltage is applied to the conductor for effectively suppressing the deterioration of the processing.

According to a second aspect of the present invention, there is provided an ion pump, comprising:

a conductor mounted within a suction port of the ion pump, the conductor being electrically insulated from the casing of the ion pump; and voltage applying means for imparting potential differing from that of the casing to the conductor.

Where the conductor is mounted within the suction port of the ion port, it is possible to obtain the function and effect similar to those obtained in the case where the conductor is mounted to the process chamber as in the vacuum processing apparatus of the present invention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
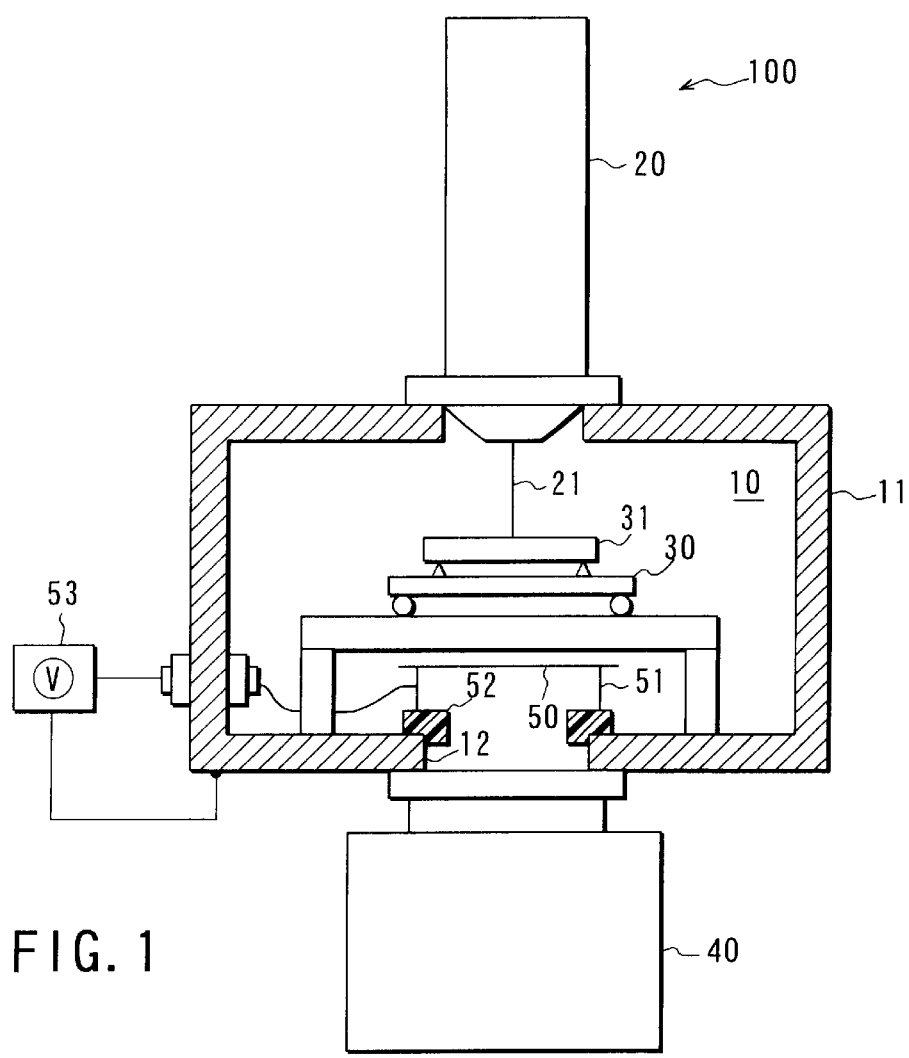
FIG. 1 is a cross sectional view schematically showing the construction of a vacuum processing apparatus according to one embodiment of the present invention.

Reference will now be made in detail to the presently preferred embodiment of the invention as illustrated in the accompanying drawings, in which like reference numerals designate like or corresponding parts.

A first embodiment of the present invention will now be described with reference to FIG. 1.

Reference numeral 100 in FIG. 1 denotes a charged beam pattern depicting apparatus as a vacuum processing apparatus of the present invention. As shown in the drawing, the charged beam pattern depicting apparatus 100 comprises a vacuum vessel 11 forming a pattern depicting chamber 10 as a process chamber, a charged beam irradiating apparatus 20 mounted to the upper surface of the vacuum vessel 11, a stage 30 arranged within the pattern depicting chamber 10, and an ion pump 40 for evacuating the pattern depicting chamber 10 to a high vacuum.

In the charged beam pattern depicting apparatus 100 of the construction described above, a pattern depicting material (target object) 31 set on the stage 30 is irradiated with a charged beam 21 emitted from the charged beam irradiating apparatus 20 so as to depict a pattern on the target object 31. The pattern depicting mechanism is not directly relevant to the present invention and, thus, detailed description thereof is omitted.

A plate-like or a mesh-like conductor 50 large enough to cover an area larger than a suction port 12 of the vacuum vessel 11 that permits the ion chamber 40 to communicate with the pattern depicting chamber 10 is arranged in the vicinity of and above the suction port 12 in FIG. 1. The conductor 50 has a plurality of legs 51 and is mounted to the vacuum chamber 11 via the legs 51 and an electrically insulating member 52.

A voltage applying means 53 is connected to the conductor 50. The voltage applying means 53 is also connected electrically to the vacuum vessel 11, which is generally connected to the ground. Therefore, a potential differing from the potential of the vacuum vessel 11, which constitutes a reference potential, is imparted to the conductor 50.

The apparatus shown in FIG. 1 is operated as follows. In the first step, the ion pump 40 is operated to set up a high vacuum within the pattern depicting chamber 10, and a pattern is depicted on the target material 31 set on the stage 30 by the charged beam 21 emitted from the charged beam irradiating apparatus 20. In this step, a potential differing from the potential of the vacuum vessel 11 is imparted from the voltage applying means 53 to the conductor 50. If a positive (+) potential is imparted to the conductor 50, the positive ions leaking from the ion pump 40 are reflected. At the same time, the electrons leaking from the ion pump 40 are adsorbed. As a result, leakage of ions and electrons into the pattern depicting chamber 10 is suppressed. By contraries, if a negative (−) potential is imparted to the conductor 50, the positive ions leaking from the ion pump 40 are adsorbed and, at the same time, the electrons are reflected, so as to suppress leakage of ions and electrons into the pattern depicting chamber 10. It follows that the target material 31 is prevented from carrying out chemical reactions with the ions and electrons leaking from the ion pump 40. Naturally, the accuracy of the pattern depiction is prevented from being lowered so as to further improve the accuracy of the pattern depiction.

It is desirable to determine in advance an appropriate value of the potential imparted to the conductor 50 in view of the degree of vacuum within the pattern depicting chamber 10, the kind of the resist used as the target material 31, the pattern depicting time and the pattern depicting conditions so as to automatically control the potential imparted to the conductor 50 in accordance with the pattern depicting conditions in the step of depicting a pattern.

Figure 2A:
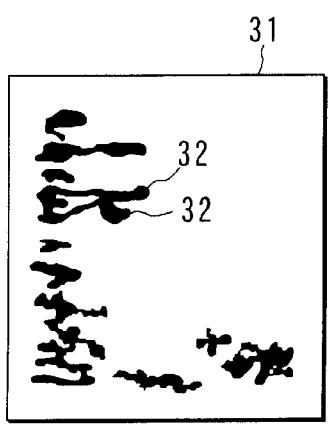
FIGS. 2A, 2B and 2C show the results of pattern depiction and development performed by the apparatus shown in FIG. 1 under the same conditions except the potentials imparted to the conductors, i.e., the results in respect of the resist remaining states in non-depicted portions appearing on the surfaces of pattern depicting materials, wherein FIG. 2A covers the case where the same potential was imparted to the conductor and the vacuum vessel, FIG. 2B covers the case where a negative potential was imparted to the conductor, and FIG. 2C covers the case where a positive potential was imparted to the conductor.
Figure 2B:
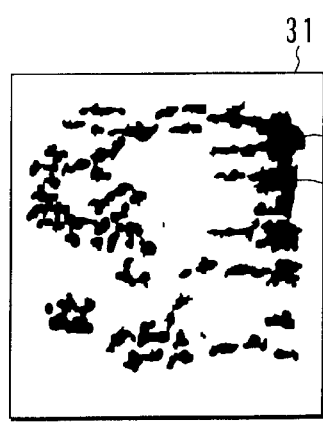
Figure 2C:
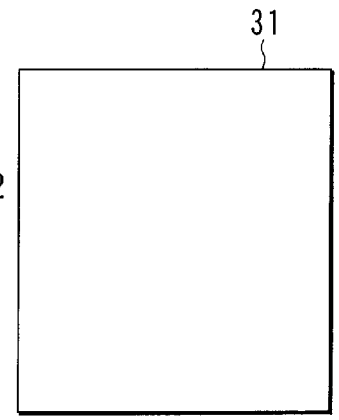

FIGS. 2A, 2B and 2C show the results of pattern depiction and development performed by the apparatus shown in FIG. 1, in which the technical idea of the present invention is applied to a charged beam pattern depicting apparatus, under the same conditions except the potentials imparted to the conductors, i.e., the results in respect of the resist remaining states in non-depicted portions appearing on the surfaces of pattern depicting materials, wherein FIG. 2A covers the case where the same potential was imparted to the conductor and the vacuum vessel, FIG. 2B covers the case where a negative potential was imparted to the conductor, and FIG. 2C covers the case where a positive potential was imparted to the conductor. The same patterns were depicted on the target material 31, and the depicted patterns were deleted to permit FIGS. 2A, 2B, 2C to show the remaining resist 32 alone appearing on the non-depicted portion.

Where the same potential is imparted to the conductor 50 and the vacuum vessel 11, a considerably large amount of residual resist 32 appears as shown in FIG. 2A. Where a negative (−) potential is imparted to the conductor 50, the amount of the residual resist 32 is increased, as shown in FIG. 2B. Further, where a positive (+) potential is imparted to the conductor 50, the residual resist is not found at all, indicating that the depicted pattern (not shown) alone appears on the target 31.

Figure 3:
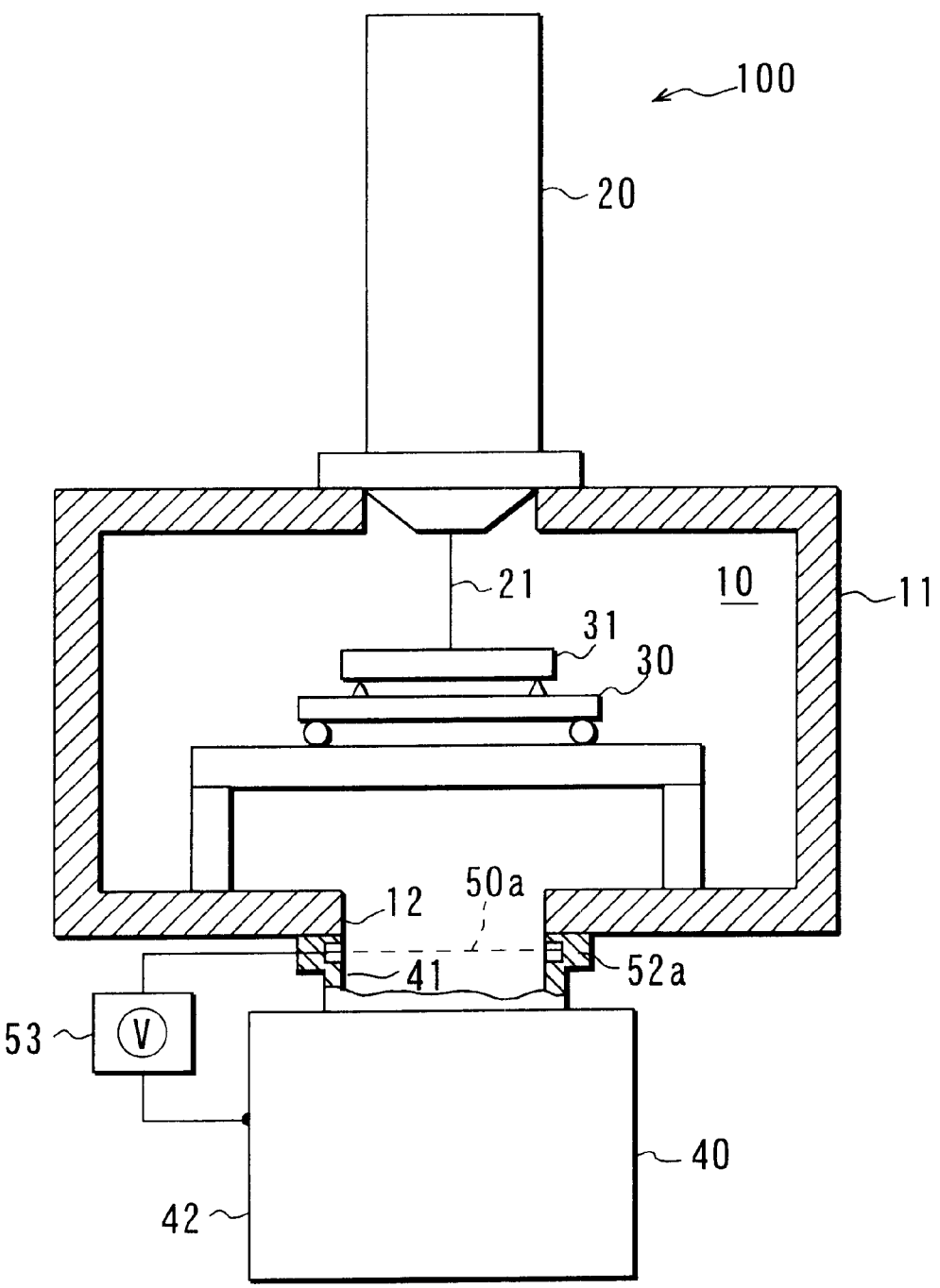
FIG. 3 is a cross sectional view schematically showing the construction of a vacuum processing apparatus according to another embodiment of the present invention.

FIG. 3 shows another embodiment of the present invention. The reference numerals commonly used in FIGS. 1 and 3 denote the same members of the apparatus and, thus, the description thereof is omitted.

In the charged beam pattern depicting apparatus shown in FIG. 3, a conductor 50a is mounted within a suction port 41 of the ion pump 40 with an electrically insulating member 52a interposed therebetween. Also, the voltage applying means 53, which is connected at one end to the conductor 50a, is connected at the other end to a casing 42 of the ion pump 40 and, then, to the vacuum vessel 11 as in the embodiment shown in FIG. 1 via the casing 42.

In the embodiment shown in FIG. 3, in which the conductor 50a is mounted on the side of the ion pump 40, it is possible to obtain the function and effect similar to those obtained by the apparatus shown in FIG. 1.

Further, if the voltage applying means 53 is incorporated on the side of the ion pump 40, an apparatus of the present invention can be prepared by simply mounting the particular ion pump 40 without modifying the main body of the charged beam pattern depicting apparatus such as the vacuum vessel 11. In other words, the ion pump 40 itself is modified in the embodiment shown in FIG. 3.

Where the conductor 50a is mounted within the inlet port 41 of the ion pump 40, it is desirable for the conductor 50a to be mesh-like or screen-like to have a large number of dispersed clearances in order to suppress effectively the leakage of ions and electrons without obstructing the evacuation to set up a high vacuum within the vacuum vessel 11.

In each of the embodiments described above, the technical idea of the present invention is applied to a charged beam pattern depicting apparatus. However, the technical idea of the present invention can be applied to a general vacuum processing apparatus that is adversely affected by the various substances such as ions and electrons leaking from the ion pump 40.

Also, in each of the embodiments described above, a positive (+) potential is imparted to the conductor 50 or 50a. However, it is desirable to impart a negative (−) potential to the conductor depending on the apparatus to which the technical idea of the present invention is applied and depending on the conditions under which the apparatus is used.

As described above, the present invention makes it possible to suppress deterioration of treatment such as a lowered accuracy of, for example, a charged beam pattern depiction caused by ions and electrons leaking from the ion pump so as to carry out the treatment as desired.

Particularly, where the technical idea of the present invention is applied to a charged beam pattern depicting apparatus, it is desirable to construct the apparatus such that the applied voltage can be controlled by the pattern depicting conditions. In this case, the accuracy of the pattern depiction can be prevented from being lowered more effectively. Further, if a positive (+) voltage is applied to the conductor, the accuracy of the pattern depiction can be prevented from being lowered further more effectively.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vacuum processing apparatus for processing a target object within a process chamber evacuated to a high vacuum by an ion pump, comprising:

a conductor arranged in a vicinity of a suction port of a process chamber communicating with said ion pump, said conductor being electrically insulated from said process chamber; and a voltage source electrically connected to said process chamber and said conductor, wherein said voltage source causes a potential difference between said process chamber and said conductor by imparting a reference potential to said process chamber and a potential differing from that of the process chamber to said conductor, thereby causing electrons or ions to be adsorbed or reflected by said conductor.

2. The vacuum processing apparatus according to claim 1, wherein said process chamber is a pattern depicting chamber for performing a pattern depiction with a charged beam.

3. The vacuum processing apparatus according to claim 2, wherein said voltage applying means is constructed such that the applied voltage can be controlled depending on the pattern depicting conditions.

4. The vacuum processing apparatus according to claim 2, wherein said voltage applying means is constructed such that a positive (+) voltage is applied to said conductor.

5. The vacuum processing apparatus according to claim 3, wherein said voltage applying means is constructed such that a positive (+) voltage is applied to said conductor.

6. An ion pump, comprising:

a conductor mounted within a suction port of the ion pump, said conductor being electrically insulated from the casing of the ion pump; and a voltage source electrically connected to said casing and said conductor, wherein said voltage source causes a potential difference between said casing and said conductor by imparting a reference potential to said casing and a potential differing from that of the casing to said conductor, thereby causing electrons or ions to be adsorbed or reflected by said conductor.

* * * * *